United States Patent [19]

Hiller

[11] Patent Number: 4,983,906
[45] Date of Patent: Jan. 8, 1991

[54] FREQUENCY ESTIMATION SYSTEM

[75] Inventor: Donald R. Hiller, Lake Stevens, Wash.

[73] Assignee: Hewlett-Packard Company, Palo Alto, Calif.

[21] Appl. No.: 395,226

[22] Filed: Aug. 17, 1989

[51] Int. Cl.$^5$ .............................................. G01R 23/14
[52] U.S. Cl. .................................. 324/79 D; 324/77 R; 364/484
[58] Field of Search ............... 364/483, 485, 487, 726; 375/81, 120, 8; 324/77 R, 78 R, 78 D, 77 B, 77 C, 77 CS, 77 D, 77 G, 77 H, 79 R, 79 D

[56] References Cited

U.S. PATENT DOCUMENTS

| | | | |
|---|---|---|---|
| 3,881,100 | 4/1975 | Works | 364/726 |
| 3,920,978 | 11/1975 | Schmitt | 364/485 |
| 4,070,762 | 1/1978 | Siddall | 33/174 Q |
| 4,310,721 | 1/1982 | Manley | 375/8 |
| 4,395,762 | 7/1983 | Wondergem et al. | 364/484 |
| 4,604,583 | 8/1986 | Aoyagi | 375/81 |
| 4,612,626 | 9/1986 | Marchant | 364/726 |
| 4,616,510 | 10/1986 | Moore | 73/861.27 |
| 4,802,098 | 1/1989 | Hansen et al. | 364/487 |
| 7,297,357 | 1/1989 | Birgenheier et al. | 375/10 |

OTHER PUBLICATIONS

"Mobile Station Conformity Specifications" Draft GSM Rec. 11.10-version 3.01.00, Jul 1990.
Tretter, S. T., *Estimating the Frequency of a Noisy Sinusoid by Linear Regression*, IEEE Transactions of Information Theory, vol. IT-31, No. 6, Nov. 1985.

*Primary Examiner*—Michael J. Tokar

[57] ABSTRACT

A signal of interest is periodically sampled and the samples decomposed into quadrature components. The signal's phase angle at each sample is computed from the ratio of the real to imaginary parts. A linear regression analysis is then performed on the sampled phase data to obtain a best estimate of the signal's phase rate of change. From this estimate, the signal frequency is determined. In superheterodye instruments, the frequency of an input signal can be deduced by analyzing an intermediate frequency signal using this technique and factoring out the frequency of intervening local oscillator(s).

11 Claims, 1 Drawing Sheet

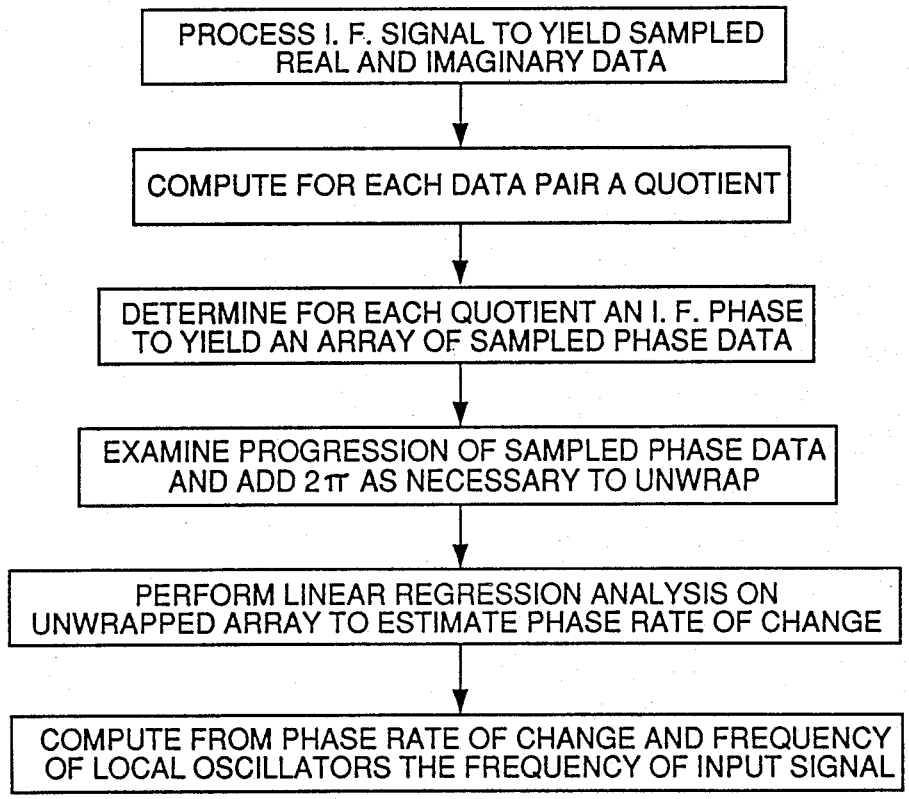

FREQUENCY ESTIMATION SYSTEM

FIELD OF THE INVENTION

The present invention relates to electronic measurement equipment, and more particularly relates to a method and apparatus for estimating the frequency of a complex sinusoid in such an instrument.

BACKGROUND AND SUMMARY OF THE INVENTION

For expository convenience, the present invention will be illustrated with reference to one particular application thereof, namely as a frequency estimator in a spectrum analyzer However, it should be recognized that the invention is not so limited.

Spectrum analyzers typically operate by mixing a signal of interest with one or more local oscillator signals to produce an intermediate frequency (IF) signal. This signal is then processed to categorize its spectral components in a spectrum of interest and the results displayed on a screen for viewing. The screen typically displays 400 data points, each representing the spectral content of the signal in one of 400 contiguous sub-bands that together span the spectrum of interest.

It is often desirable to measure the frequency of a particular spectral component. The limited screen resolution, however, makes such measurement difficult. For example, if the instrument is analyzing a signal's spectral components in the range of 10 to 20 MHz, each of the 400 sub-bands (or "bins" as they are often called) represents 25 KHz of the spectrum. Thus, it is impossible to discern from the display the frequency of a particular frequency component to an accuracy better than 25 KHz.

In the prior art, some attempts have been made to better resolve the frequency of signal components in spectrum analyzers. These attempts have principally involved counting zero crossings of the instrument's IF signal over a fixed period of time and deducing from such number of crossings the frequency of the signal. Such approaches, however, require extended periods of time to obtain accurate results and further require hardware not normally included in the instrument.

To more quickly and simply provide an accurate frequency estimate, the present invention monitors the phase of the IF waveform at a plurality of periodically spaced sample points. These phase samples are "unwrapped" to provide cumulative phase totals at each sampled point of the waveform. The phase rate of change is then determined by linear regression techniques. Since the phase rate of change is the signal frequency, the result of the linear regression analysis yields the IF frequency. The frequency of the input signal waveform can then be determined since the frequencies of the local oscillators with which the input signal waveform was mixed are known.

The foregoing and additional features and advantages of the present invention will be more readily apparent from the following detailed description, which proceeds with reference to the accompanying drawings.

BRIEF DESCRIPTION OF THE DRAWING

FIG. 1 is a schematic block diagram of a spectrum analyzer employing a frequency estimator according to one embodiment of the present invention.

FIG. 2 is a flow chart of a process according to one embodiment of the present invention.

DETAILED DESCRIPTION

Referring to FIG. 1, a spectrum analyzer 10 typically comprises an analog signal input 12, one or more frequency conversion stages 14, and a processing circuit 16. The conversion stage(s) 14 each comprise a mixer 18, a local oscillator 20 and an image filter 22 that cooperate to translate the signal to an intermediate frequency (IF). The processing circuit 16 processes the IF signal to yield digital data sequences corresponding to real and imaginary components of the signal at periodic intervals.

In the illustrated embodiment, the processing circuit 16 comprises an analog to digital converter 24, a pair of mixers 26, 28, and a pair of filters 30, 32. The analog to digital converter 24 samples the IF signal at periodic intervals and outputs a series of digital data samples corresponding thereto. These digital samples are multiplied with $\sin \omega t$ and $\cos \omega t$ signals by the mixers 26, 28 to yield digital representations of the real and imaginary components of the IF signal. The filters 30, 32 filter out spurious mixer products.

The foregoing circuitry and numerous variations thereon are well known in the art, as described, inter alia. in U.S. Pat. No. 4,594,555, the disclosure of which is incorporated herein by reference.

An apparatus according to the illustrated embodiment of the present invention further includes a first arithmetic processor 34 to which the real and imaginary signal samples are applied. This processor computes the real/imaginary quotient for each sample pair to determine the tangent of the IF signal phase angle. By executing an arctangent function, the processor can then determine the phase of the IF signal.

The arctangent function usually yields a phase between 0 and $2\pi$. In the illustrated embodiment of the present invention, the phase must generally be "unwrapped," i.e. not bounded by this range. The processor 34 thus monitors the progression of the phase computed by the arctangent function and adds $2\pi$ each time the phase begins crosses $2\pi$ and again at 0. The unwrapped, or cumulative phase for each sample pair is stored in a memory 36, which may be a large FIFO register.

When it is desired to measure the frequency of the incoming signal waveform, the phase points stored in memory 36 are read by a second processor 38. The second processor performs a linear regression analysis on this array of points to determine a best estimate of the phase rate of change. While the analysis is numerically performed using a formula set forth below, it may be conceptualized as plotting the cumulative phase points on a graph as a function of time and fitting a straight line through the points. The slope of this line is the IF signal's phase rate of change, or frequency.

Standard linear regression formulas adapted for the variables phase and time yield a frequency estimate F as follows:

$$F = K_1 \sum_{i=0}^{n-1} (2i - (n-1)) P[i] \tag{1}$$

where there are n complex points X[i];
P[i] is the unwrapped phase of points X[i]; and
$K_1 = 6/(n(n+1)(n-1))$.

If noise in the sampled signal is truly independent, if the signal is sampled at more than the Nyquist rate, and if the signal to noise ratio is reasonable j(i.e. greater than 10:1), then the variance of the frequency estimate E is as follow:

$$E = N\sqrt{2}K_1 \qquad (2)$$

where N is the variance of noise in P[i]in radians ($\approx$(signal/noise)/$\sqrt{2}$)).

The second processor 38 outputs data indicative of the IF frequency estimate to a third processor 40. The third processor is provided information on the frequency of the local oscillator signal with which the incoming signal was mixed, so can compute the frequency of the original input signal. Data indicative of this computed frequency is provided to a display driver circuit 42 and presented on an instrument display 44.

While the illustrated embodiment is described, for ease of explanation, as having three processors, the circuit is actually implemented with one, a Motorola 68000 series microprocessor with associated memory that performs the functions of illustrated processors 34, 38 and 40 and FIFO memory 36.

FIG. 2 is a flow chart illustrating the sequence of steps performed by the illustrated embodiment.

Having illustrated the principles of my invention with reference to a preferred embodiment, it will be apparent that the invention can be modified in arrangement and detail without departing from such principles. For example, while the illustrated embodiment has been described as including one or more conversion stages, it will be recognized that the invention can also be advantageously applied to baseband systems that do not employ conversion stages Similarly, while the illustrated embodiment is described as mixing the incoming signal using an analog mixer, converting the resulting IF signal into digital form, and multiplying the digital IF by sine and cosine signals to yield the real and imaginary parts, it will be recognized that other arrangements can be used. For example, the signal can be left in analog form through the first arithmetic processor 34 by using analog components instead of digital. Similarly, the conversion to digital form can take place prior the first mixer and all subsequent stages can be purely digital.

In still another embodiment of the present invention, the phase differences between adjacent sample points, rather than their absolute phases, can be measured. Such an embodiment is sometimes simpler to implement and, after application of the linear regression analysis, yields a best weighted average of the phase differences. Since the sampling interval is fixed and known, this average phase difference can readily be used to again determine the frequency of the I.F. signal. (As in the illustrated embodiment, the process must again recognize the wraparound behavior of the tangent function and account for it in computing phase differences.)

In view of these and the wide variety of other embodiments to which the principles of my invention may be applied, it should be recognized that the illustrated embodiment is to be considered illustrative only and not as limiting the scope of the invention. Instead, I claim as my invention all such modifications as may come within the scope and spirit of the following claims and equivalents thereto.

I claim:

1. An electronic measurement instrument comprising:
   input means for receiving an analog waveform;
   signal processing means for converting said analog waveform into digital data sequences corresponding to real and imaginary components of the waveform at a number of points therealong;
   means for determining from said real and imaginary data sequences a phase datum at a number of points along the analog signal; and
   means for performing a linear regression fit on said number of phase data to determine a best estimate of the phase rate of change of the analog waveform;
   wherein the phase datum is a cumulative phase of the analog signal waveform.

2. The instrument of claim 1 in which the phase datum is a phase difference between two of said points along the analog signal waveform.

3. The instrument of claim 1 in which the signal processing means comprises:
   converter means for periodically sampling said waveform to produce a sequence of digital samples corresponding thereto;
   means for multiplying said digital samples by a sine signal to yield a data sequence corresponding to the real portion of the analog waveform; and
   means for multiplying said digital samples by a cosine signal to yield a data sequence corresponding to the imaginary portion of the analog waveform.

4. The instrument of claim 1 in which the input means further includes means for mixing the analog waveform with a local oscillator signal to translate said analog waveform to an IF frequency, and in which the instrument further includes means for determining from the best estimate of the translated analog waveform's phase rate of change the frequency of the input analog waveform 5. The instrument of claim 1 in which:
   the input means further includes:
   means for mixing the analog waveform with a local oscillator signal to translate said analog waveform to an IF frequency;
   the processing means further includes:
   converter means for periodically sampling said waveform to produce a sequence of digital samples corresponding thereto;
   means for multiplying said digital samples by a sine signal to yield a data sequence corresponding to the real portion of the analog waveform; and
   means for multiplying said digital samples by a cosine signal to yield a data sequence corresponding to the imaginary portion of the analog waveform;
   and in which the instrument further includes means for determining from the best estimate of the translated analog waveform's phase rate of change the frequency of the input analog waveform.

6. The instrument of claim 5 in which the phase datum is a cumulative phase of the analog signal waveform.

7. The instrument of claim 5 in which the phase datum is a phase difference between two of said points along the analog signal waveform.

8. A method for determining the frequency of a signal input to a superheterodyne instrument, the method comprising the steps:
   processing an intermediate frequency signal in said instrument to periodically quantify the real and imaginary parts thereof and to produce arrays of first and second data corresponding thereto, respectively;

computing, for each of a plurality of said first and second data pairs, the quotient of one of said data divided by the other;

determining from each of said quotients a phase of the intermediate frequency signal to yield an array of sampled phase data;

examining the progression of sampled phase data with time and adding $2\pi$ thereto as necessary to unwrap the sampled phases;

performing a linear regression analysis on the unwrapped array of sampled phase data to estimate the phase rate of change; and computing from said phase rate of change and frequencies of one or more local oscillator signals the frequency of the signal input to the instrument.

9. A method for determining the frequency of a signal input to a superheterodyne instrument, the method comprising the steps:

processing an intermediate frequency signal in said instrument to periodically quantify the real and imaginary parts thereof and to produce a pair of first and second data corresponding thereto, respectively;

determining from each of said pairs a phase datum related thereto;

performing a linear regression analysis on the phase data to estimate the intermediate frequency signal's phase rate of change; and computing from said phase rate of change and frequencies of one or more local oscillator signals the frequency of the signal input to the instrument.

10. The method of claim 9 in which said phase datum is a cumulative phase of the intermediate frequency signal.

11. The method of claim 9 in which said phase datum is a phase difference of the intermediate frequency signal between two of said periodically quantified data pairs.

* * * * *